United States Patent [19]
Baba et al.

[11] Patent Number: 4,891,333
[45] Date of Patent: Jan. 2, 1990

[54] SEMICONDUCTOR DEVICE AND MANUFACTURING METHOD THEREOF

[75] Inventors: Hiroyuki Baba; Takashi Matsuzaki, both of Hyogo, Japan

[73] Assignee: Kabushiki Kaisha Toshiba, Kawasaki, Japan

[21] Appl. No.: 150,499

[22] Filed: Feb. 1, 1988

Related U.S. Application Data

[63] Continuation of Ser. No. 776,804, Sep. 17, 1985, abandoned.

[30] Foreign Application Priority Data

Oct. 9, 1984 [JP] Japan ................... 59-211960

[51] Int. Cl.$^4$ ............................ H01L 23/50
[52] U.S. Cl. ..................... 437/173; 437/209; 437/219; 437/224; 219/56.22; 219/148
[58] Field of Search ............... 437/209, 210, 211, 212, 437/213, 214, 215, 216, 217, 218, 219, 220, 221, 222, 223, 224, 173; 357/67, 70, 72; 228/904; 219/56.1, 56.21, 56.22, 148

[56] References Cited

U.S. PATENT DOCUMENTS

| | | | |
|---|---|---|---|
| 3,706,840 | 12/1972 | Moyle et al. | 437/219 |
| 3,729,820 | 5/1973 | Ihochi et al. | 437/209 |
| 3,914,858 | 10/1975 | Sonoda et al. | 29/588 |
| 4,188,438 | 2/1980 | Burns | 437/209 |
| 4,218,701 | 8/1980 | Shirasaki | 437/215 |
| 4,224,499 | 9/1980 | Jones | 219/121 LM |
| 4,248,920 | 2/1981 | Yoshizumi | 428/76 |
| 4,264,917 | 4/1981 | Ugon | 437/211 |
| 4,380,775 | 4/1983 | Bischoff | 437/209 |
| 4,384,899 | 5/1983 | Myers | 437/216 |
| 4,422,233 | 12/1983 | Habdas et al. | 437/218 |
| 4,434,347 | 2/1984 | Kurtz et al. | 219/56.22 |
| 4,530,002 | 7/1985 | Kanai | 357/68 |
| 4,604,642 | 8/1986 | Sakurai | 357/70 |
| 4,633,573 | 1/1987 | Scherer | 437/211 |
| 4,649,637 | 3/1987 | Hatakeyama | 437/219 |

FOREIGN PATENT DOCUMENTS

| | | | |
|---|---|---|---|
| 0137664 | 10/1981 | Japan | 357/70 |
| 58-89831 | 5/1983 | Japan | 437/173 |
| 60-22328 | 2/1985 | Japan | 437/173 |

*Primary Examiner*—Olik Chaudhuri
*Attorney, Agent, or Firm*—Oblon, Spivak, McClelland, Maier & Neustadt

[57] ABSTRACT

This invention concerns a semiconductor device manufacturing method wherein connection is made of the end portion of aluminium bonding wire to a lead electrode of material selected from the group consisting of copper and copper alloy in a manner such that the reaction layer thickness is 0.2 micron or more, thereby resulting in excellent electrical characteristics in high temperature conditions or in high temperature, high humidity conditions.

13 Claims, 5 Drawing Sheets

SEMICONDUCTOR DEVICE AND MANUFACTURING METHOD THEREOF

This application is a continuation of application Ser. No. 776,804, filed on Sept. 17, 1985, now abandoned.

BACKGROUND OF THE INVENTION

(1) Field of the Invention

The present invention relates to a semiconductor device and method of manufacture thereof.

More particularly, the invention relates to a semiconductor device in which one end of a bonding wire whose other end is connected to a bonding pad of a semiconductor element is in good connection to a lead frame and which displays excellent electrical properties in high temperature conditions or in high temperature, high humidity conditions.

(2) Description of the Prior Art

As shown in FIG. 1, in a conventional semiconductor device manufacturing method, a Ni plating layer 2 is formed on the surface of a lead electrode 1 made of copper, etc. and a bonding pad 5 on a semiconductor element 4 and the lead electrode 1 are connected via this Ni plating layer 2 by a bonding wire 3. In the drawing, a resin sealing body 6 and a solder layer 7 are formed via a Ni plating layer 9 on a lead frame 8.

However, with a device in which Ni plating layers 2 and 9 are formed, there are the problems that there is considerable variation in plating quality, that the manufacturing process for effecting plating treatment is complex and that the plating treatment makes manufacturing costs higher, etc. A practice in recent years, therefore, has been to effect direct connection of an aluminium bonding wire 3 onto a lead electrode 1 of copper, etc. without carrying out plating treatment.

However, in testing of semiconductor devices with aluminium bonding wires 3 connected directly to lead electrodes 1 of copper, etc. in long-time shelf tests in high temperature conditions (150° C., 175° C.) or in high temperature (about 80° C.), high humidity (about 90%) conditions, there has been found to be a problem of reduced reliability because of opening at the bond interface between bonding wires 3 and lead electrodes 1.

A technique for resolving this problem in which bonding wire spanning between bonding wire constituted by copper wire and a lead frame made of copper is effected by selectively activating the bonding region is disclosed in Japanese Patent Application No. 55-88318. However, in this technique there are the problems that oxide forming on the bonding wire causes bond faults and that it is difficult to form a set ball at the bonding wire end portion. Further, working characteristics are poor because the bonding area has to the activated in each bonding process.

Japanese Patent Application No. 57-51237 discloses a bonding process technique in which a ball of required shape is formed and bonding oxidation is prevented by introducing a capillary end portion leading out from a bonding wire under a cover where a reducing atmosphere is maintained. However, this technique requires a complex structure including a cover for maintaining a reducing atmosphere and when the bonding process is effected at a process speed of one second or less there is the problem that maintenance and control are troublesome since faults occur easily. There is also the problem that it is not possible to effect highly reliable bonding between bonding wire constituted by copper wire and a lead frame made of copper since it is not possible to prevent oxidation on the lead frame side where an external lead is formed.

SUMMARY OF THE INVENTION

It is the object of the present invention to provide a highly reliable semiconductor device which displays excellent electrical characteristics in high temperature conditions or in high temperature, high humidity conditions and a manufacturing method which makes possible the easy production of such a semiconductor device.

The invention is a semiconductor device and manufacturing method thereof which displays excellent electrical characteristics in high temperature conditions or in high temperature, high humidity conditions thanks to connection of an end portion of aluminium bonding wire to lead electrode of copper or copper alloy in a manner such that the reaction layer thickness is made 0.2 (micron) or more.

BRIEF DESCRIPTION OF THE DRAWINGS

A better understanding of the invention together with a ready appreciation of other objects and many of the attendant advantages thereof may be had from the following description considered with reference to the attached drawings, in which like reference numbers indicate like parts and in which.

DESCRIPTION OF PREFERRED EMBODIMENTS

Figure 1:
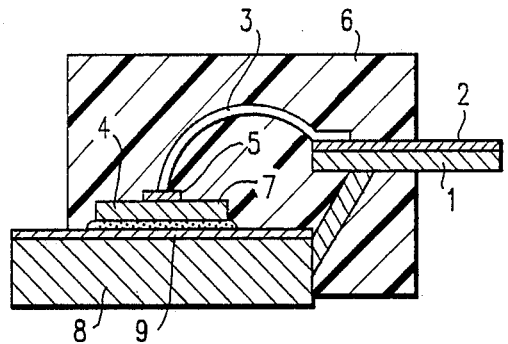
FIG. 1 is a cross-section of a semiconductor device manufactured by a conventional method.
Figure 2:
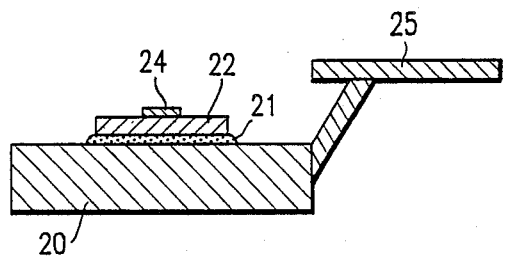
FIGS. 2-5 and FIG. 7 are explanatory drawings illustrating the method of the invention in the order of steps therein.

The method of the invention and semiconductors in embodiments thereof will now be described with reference to the attached drawings. First, as shown in FIG. 2, a semiconductor element 22 is mounted on a mount portion of a lead frame 20 made of copper or copper alloy via a solder layer 21. The copper alloy employed here may be phosphor bronze or be another copper alloy containing iron.

Figure 3:
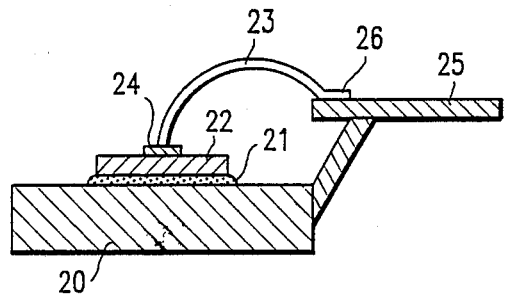

Next, as shown in FIG. 3, one end of 200 (microns) of bonding wire 23 made of 99.99% pure aluminium is fused to a bonding pad 24 on the semiconductor element 22 by ultrasonic bonding process. Then, the other end of the bonding wire 23 is similarly fused by ultrasonic bonding process to a lead electrode 25 of the lead frame 20. Like the lead frame 20, the lead electrode 25 also is formed by copper or a copper alloy.

Next, heat treatment is effected to make the thickness of the aluminium and copper or copper alloy reaction layer formed at the portion where the bonding wire 23 and lead electrode 25 are fused together 0.2 (micron) or more.

Figure 4:
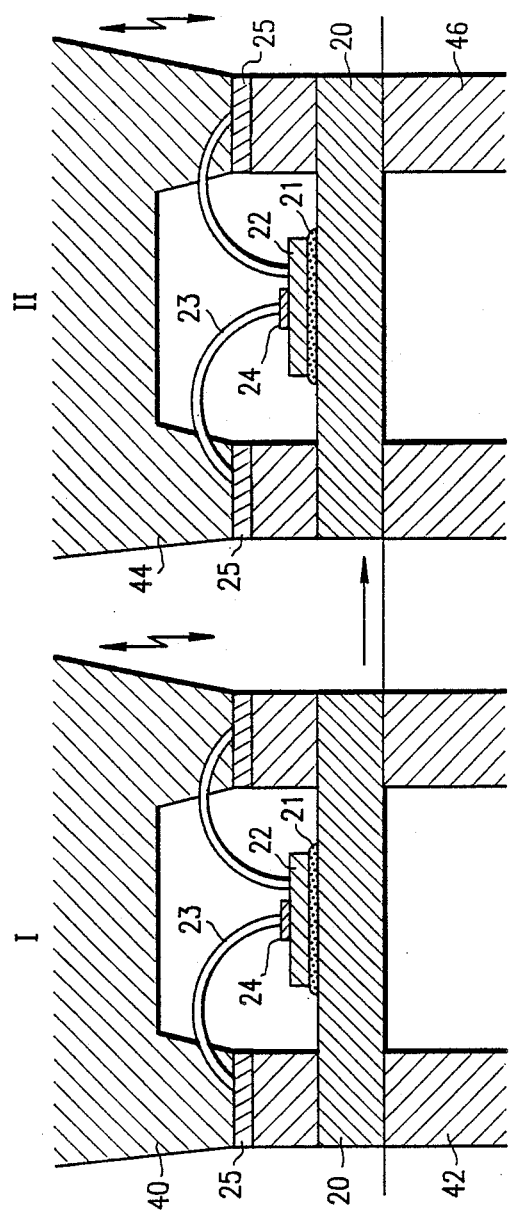
Figure 5:
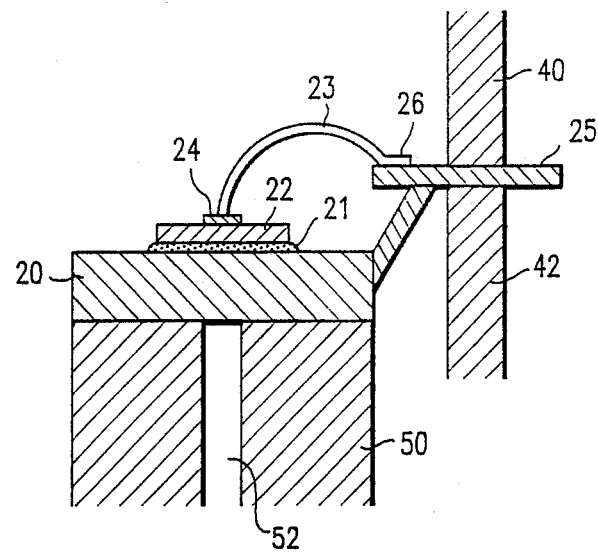
Figure 6:
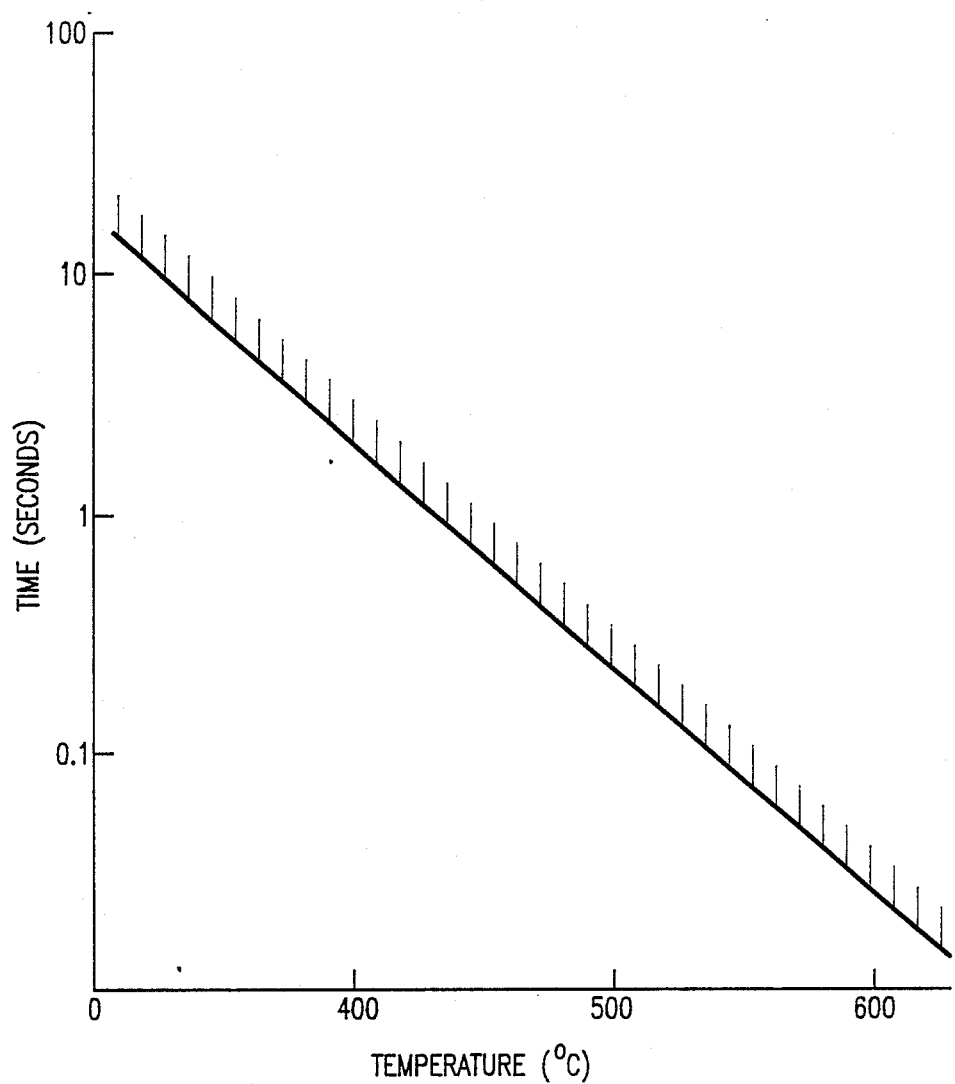
FIG. 6 is a graph showing the relation between time and temperature for reaction layer formation.

As shown in FIG. 4, in order to effect heat treatment on the lead electrode 25, heaters 40 and 42 with a temperature of about 600° C. hold the lead electrode 25 from above and below and transfer heat at a location where the lead frame 20 has been advanced to position I. Successive shifts of the lead frame 20 from the left towards the right as seen in FIG. 4 are effected about once every 1.2–1.3 second. That is, one-time contact of the heater 40 gives insufficient transfer of heat for formation of a reaction layer of 0.2 (micron) or more and so formation of a reaction layer with a thickness of 0.2 (micron) or more is brought about by the provision of heaters in a number of places combined with shifts of the lead frame 20. FIG. 4 illustrates the case where there are two places, I and II. In this embodiment, the heater contact time is about 0.5 seconds and heaters are provided in five places. FIG. 5 shows a cross-section of the state of FIG. 4 seen from the side. In FIG. 5, the lead frame 20 is set on a pedestal 50, which is provided with a blow hole 52 for a mixed gas containing nitrogen for cooling the lead frame 20. This is in order to prevent melting of the solder layer 21 due to the lead frame 20 being heated by the heaters 40 and 42 as well as the lead electrode 25. An air atmosphere may be used for the heat treatment but since the copper or copper alloy frame is oxidized as heating proceeds it is preferable to have a non-oxidizing atmosphere or a reducing atmosphere. In this embodiment, use is made of a mixed gas containing 90% $N_2$ and 10% $H_2$. The non-oxidizing gas employed here may be inert gas, be reducing gas or be mixed gas thereof. For example, the inert gas may be argon or helium and the reducing gas may be hydrogen. FIG. 6 shows the relation between time and temperature for reaction layer fomation. In this embodiment, the temperature of the bonding portion 26 is set at 400°–450° C. and heating treatment is effected to give a total amount of intermittent heating time of about 5 seconds. Heating is not limited to being intermittent heating, it being simply necessary to have a total heating time of about 5 seconds.

Although description was given above with reference to a heating method in which elements are held between heaters, another method that may be employed is to effect heating by several tens of seconds to several minutes passage of the lead frame through a hydrogen oven or a nitrogen oven at a temperature of 350°–400° C. Other methods include a method in which the lead electrode 25, leaving out the bonding portion 26, is heated with a burner torch, a method in which the lead electrode 25 is heated using a resistance welder and a method in which the lead electrode 25 is heated using a laser. Further, there is no restriction to these methods but any other method apart from these may be used as long as it permits heating with the temperature and time controlled in the range of the upper portion including the shaded portion of FIG. 6.

From the constitutional diagram and sectional examination of the abovenoted reaction layer, the composition of the reaction layer is inferred to be $Al_2Cu$, AlCu.

Figure 7:
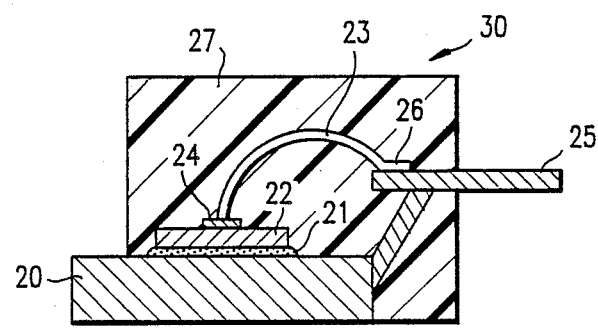

Subsequently, as shown in FIG. 7, mold treatment is effected to give a semiconductor device 30 in which the semiconductor element 22, lead frame 20, bonding wire 23 and lead electrode 25, etc. are sealed as an integral unit in resin sealing body 27.

Since connection of the bonding wire 23 and lead electrode 25 is effected with formation of a reaction layer that is 0.2 (micron) or more in the semiconductor device 30 thus produced, it is made possible to prevent opening faults in the bonding wire 23 and lead electrode 25 bond portion even in high temperature conditions or high temperature, high humidity conditions, and as a result there is produced a highly reliable semiconductor device 30. Also, the manufacturing process is simplified and manufacturing costs can be reduced since there is no need to effect plating treatment on the lead frame 20 and lead electrode 25.

The reason for making the thickness of the reaction layer formed by the aluminium and copper or copper alloy 0.2 (micron) or more is that, as is made clear from the test examples described below, products that are rejects because of opening faults occur in high temperature conditions or high temperature, high humidity conditions if the thickness is less than 0.2 (micron).

TEST EXAMPLES

Figure 8:
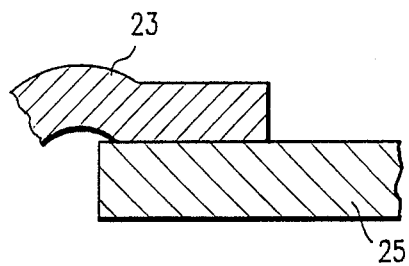
FIGS. 8-10 are explanatory drawings showing lead electrode and bonding wire connection states.

As illustrated in FIGS. 2–5 and FIG. 7, semiconductor elements 22 were mounted in a non-oxidizing atmosphere on lead frames 20 of copper or copper alloy on which plating layers had not been formed and then aluminium bonding wires 23 bridging bonding pads 24 of the semiconductor elements 22 and lead electrodes 25 of lead frames 20 were attached by ultrasonic bonding process. Next, mold treatment of these assemblies was effected to give semiconductor devices (Test Products 1). In this case, as illustrated in FIG. 8, no plating layer was formed on the surface of the lead electrodes 25 and there was no reaction layer present between the bonding wires 23 and the lead electrodes 25.

Semiconductor devices constituting Test Products 2 were manufactured by mounting semiconductor elements 22 and bonding bonding wires 23 and lead electrodes in the same way as for Test Products 1 after thorough reduction of the lead frames 20 in a high temperature reducing atmosphere.

Figure 9:
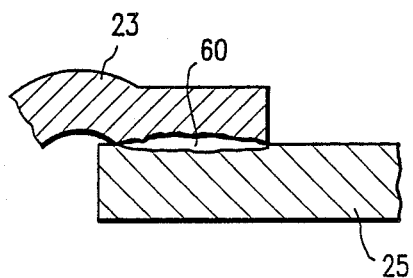

Semiconductor devices were produced in the same way as Test Products 2 except that reaction layers 60 were formed between the bonding wires 23 and lead electrodes 25 as shown in FIG. 9 by heat treatment following connection of the bonding wires 23 and lead electrodes 25. In this case, devices with a reaction layer 60 thickness of 0.1 (micron) or less were taken as Test Products 3, devices with 0.2–0.5 (micron) as Test Products 5 and devices with 1–2 (microns) as Test Products 6.

Figure 10:
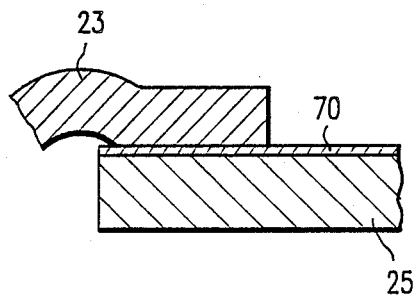

Semiconductor devices produced in the same way as Test Products 2 after preliminary formation of Ni plating layers 70 on the lead frames 20 and lead electrodes 25 as shown in FIG. 10 were taken as Test Products 7.

High temperature shelf tests consisting of 500 hours, 1000 hours, 1500 hours, 2000 hours and 2500 hours or more at 150° C. and 300 hours, 500 hours, 1000 hours and 1500 hours or more at 175° C. were conducted on 20 each of the semiconductor device Test Products 1–7 produced in the abovedescribed manner. Investigation of occurrence of rejects because of opening faults between bonding wires 23 and lead electrodes 25 gave the results noted in the following table.

TABLE

| Sample | Temperature at which left | | | | | | | | | |
|---|---|---|---|---|---|---|---|---|---|---|
| | 150° C. | | | | | 175° C. | | | | |
| | Hours left | | | | | | | | | |
| | 500 | 1000 | 1500 | 2000 | 2500 | 300 | 500 | 1000 | >1500 | |
| Test Product 7 | 0 | 0 | 0 | 0 | 0 | 0 | 0 | 0 | 0 | With Ni plating layers |

TABLE-continued

| | Temperature at which left | | | | | | | | | |
|---|---|---|---|---|---|---|---|---|---|---|
| | 150° C. | | | | | 175° C. | | | | |
| | Hours left | | | | | | | | | |
| Sample | 500 | 1000 | 1500 | 2000 | 2500 | 300 | 500 | 1000 | >1500 | |
| Product 1 | 0 | 0 | 2 | 10 | 20 | 1 | 7 | 20 | — | With no Ni plating layers and reaction layers |
| Product 2 | 0 | 0 | 0 | 3 | 7 | 0 | 0 | 5 | 13 | With no Ni plating layers and reaction layers |
| Product 3 | 0 | 0 | 0 | 1 | 3 | 0 | 0 | 3 | 6 | Reaction layer <0.1 micron |
| Product 4 | 0 | 0 | 0 | 0 | 0 | 0 | 0 | 0 | 0 | 0.2–0.5 micron |
| Product 5 | 0 | 0 | 0 | 0 | 0 | 0 | 0 | 0 | 0 | 0.5–1 micron |
| Product 6 | 0 | 0 | 0 | 0 | 0 | 0 | 0 | 0 | 0 | 1–2 microns |

As is clear from the above table, the number of rejects occuring because of opening faults becomes smaller as the reaction layers formed by the copper or copper alloy and aluminium is larger and it is seen that when the thickness of the reaction layer is 0.2 (micron) or more high reliability equivalent to that of devices with Ni plating layers in displayed.

Long-term shelf tests at high temperature and high humidity (80° C., 90%) were conducted on the above-described semiconductor device Test Products 1–7 and it was found that there was similarly no occurrence of rejects when the reaction layer thickness was 0.2 (micron) or more. Futher, similar results were obtained in thermal impact tests (−45° C.↔150° C.) and thermal fatique tests too.

As described above, with semiconductor devices and method for their manufacture according to the invention, it is possible to easily produce highly reliable semiconductor devices which display excellent electrical characteristics in high temperature conditions or in high temperature, high humidity conditions.

What is claimed is:

1. Semiconductor device manufacturing method comprising the steps of:
   connecting one end of a bonding wire made of aluminum to a bonding pad of a semiconductor element mounted on a lead frame made of a material selected from the group consisting of copper and copper alloy;
   bonding the other end of said bonding wire to a lead electrode of said lead frame, said lead electrode made of a material selected from the group consisting of copper and copper alloy;
   heating said bonding portion of said other end of said wire connected to said lead electrode at a temperature below the melting point of said bonding wire for a predetermined time period until a reaction layer with a thickness of 0.2 micron or more is formed by said copper or copper alloy and aluminum; and
   molding said semiconductor element, said bonding pad, and said bonding wire including the bonding portion of said other end thereof with a resinous material entirely.

2. Method according to claim 1, wherein said heating step consists of heating effected with said lead electrode held between heater elements.

3. Method according to claim 2, wherein holding by said heater elements is effected intermittently.

4. Method according to claim 2, wherein non-oxidizing gas is blown onto said lead frame from below during heating by said heater elements.

5. Method according to claim 4, wherein said non-oxidizing gas comprises a reducing gas.

6. Method according to claim 5, wherein said reducing gas is hydrogen.

7. Method according to claim 4, wherein said non-oxidizing gas comprises an inert gas.

8. Method according to claim 7, wherein said inert gas is a gas selected from the group consisting of nitrogen, argon and helium.

9. Method according to claim 1, wherein said heating step consists of heating by passage through a hydrogen oven.

10. Method according to claim 1, wherein said heating step is effected by heating said lead electrode apart from said bonding portion with a burner torch.

11. Method according to claim 1, wherein said heating step consists of heating said lead electrode by a resistance heating system.

12. Method according to claim 1, wherein said heating step consists of heating said bonding portion by laser irradiation.

13. Method according to claim 2, wherein said holding by said heater elements is effected continuously.

* * * * *